(12) United States Patent
Agarwal et al.

(10) Patent No.: US 10,382,019 B2
(45) Date of Patent: Aug. 13, 2019

(54) TIME BORROWING FLIP-FLOP WITH CLOCK GATING SCAN MULTIPLEXER

(71) Applicant: Intel Corporation, Santa Clara, CA (US)

(72) Inventors: Amit Agarwal, Hillsboro, OR (US); Steven K. Hsu, Lake Oswego, OR (US); Simeon Realov, Portland, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/992,052

(22) Filed: May 29, 2018

(65) Prior Publication Data

US 2018/0278243 A1 Sep. 27, 2018

Related U.S. Application Data

(63) Continuation of application No. 15/246,445, filed on Aug. 24, 2016, now Pat. No. 9,985,612.

(51) Int. Cl.
*H03K 3/356* (2006.01)
*H03K 3/3562* (2006.01)
*H03K 19/00* (2006.01)
*H03K 19/20* (2006.01)
*H03K 3/037* (2006.01)

(52) U.S. Cl.
CPC ....... *H03K 3/3562* (2013.01); *H03K 19/0002* (2013.01); *H03K 19/20* (2013.01); *H03K 3/0375* (2013.01)

(58) Field of Classification Search
CPC ... H03K 3/3562; H03K 19/0002; H03K 19/20
USPC ......................................................... 327/203
See application file for complete search history.

(56) References Cited

U.S. PATENT DOCUMENTS

| | | | |
|---|---|---|---|
| 6,271,700 B1 | 8/2001 | Itaya | |
| 6,304,122 B1 | 10/2001 | Gregor et al. | |
| 8,352,815 B2 * | 1/2013 | Frederick, Jr. | ............................... G01R 31/318541 327/202 |
| 9,331,680 B2 | 5/2016 | Gurumurthy | |
| 9,612,281 B2 * | 4/2017 | Lou | .................. G01R 31/31725 |
| 9,915,933 B2 * | 3/2018 | Kim | ..................... G05B 19/045 |
| 2004/0075479 A1 | 4/2004 | Gupta | |
| 2005/0015214 A1 * | 1/2005 | Mittal | .............. G01B 31/31854 702/117 |
| 2006/0132209 A1 | 6/2006 | Meltzer et al. | |
| 2007/0001731 A1 | 1/2007 | Branch | |
| 2007/0001733 A1 * | 1/2007 | Branch | .................. G11C 29/32 327/218 |

(Continued)

OTHER PUBLICATIONS

International Search Report and Written Opinion for International Patent Application PCT/US2017/043236, dated Nov. 1, 2017.

(Continued)

*Primary Examiner* — Ryan Jager
(74) *Attorney, Agent, or Firm* — Green, Howard & Mughal, LLP

(57) ABSTRACT

An apparatus is provided which comprises: a multiplexer which is gated by a clock; and a flip-flop coupled to the multiplexer, wherein the flip-flop has a chain of at least four inverters one of which has an input to receive the clock.

18 Claims, 6 Drawing Sheets

(56) References Cited

U.S. PATENT DOCUMENTS

| | | | |
|---|---|---|---|
| 2007/0022339 A1* | 1/2007 | Branch | G01B 31/318552 714/726 |
| 2007/0300108 A1 | 12/2007 | Saint-Laurent | |
| 2009/0051388 A1 | 2/2009 | Flynn | |
| 2009/0300448 A1* | 12/2009 | Tomita | G01B 31/318541 714/731 |
| 2010/0162058 A1 | 6/2010 | Brown | |
| 2011/0102017 A1 | 5/2011 | Lewis et al. | |
| 2014/0266365 A1* | 9/2014 | Penzes | H03K 3/012 327/203 |
| 2016/0094203 A1* | 3/2016 | Nandi | H03K 3/35606 327/203 |
| 2016/0097811 A1 | 4/2016 | Kim | |
| 2016/0112036 A1 | 4/2016 | Goyal et al. | |
| 2016/0179074 A1* | 6/2016 | Kim | G05B 19/045 326/16 |
| 2016/0241219 A1 | 8/2016 | Kim | |

OTHER PUBLICATIONS

Non Final Office Action for U.S. Appl. No. 15/246,445, dated Jun. 6, 2017.

Non-Final Office Action for U.S. Appl. No. 15/246,445, dated Sep. 14, 2017.

Notice of Allowance for U.S. Appl. No. 15/246,445, dated Feb. 14, 2018.

Restriction Requirement dated Mar. 8, 2017 for U.S. Appl. No. 15/246,445.

Supplemental Notice of Allowability for U.S. Appl. No. 15/246,445, dated Mar. 5, 2018.

International Search Report on Patentability dated Mar. 7, 2019 for PCT Patent Application No. PCT/US2017/043236.

* cited by examiner

TIME BORROWING FLIP-FLOP WITH CLOCK GATING SCAN MULTIPLEXER

CLAIM FOR PRIORITY

This application is a continuation of and claims priority to U.S. patent application Ser. No. 15/246,445, filed on Aug. 24, 2016, and titled "TIME BORROWING FLIP-FLOP WITH CLOCK GATING SCAN MULTIPLEXER," issued as U.S. Pat. No. 9,985,612 on May 29, 2018, and of which are incorporated by reference in their entirety.

BACKGROUND

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets.

Time borrowing flip-flops have been traditionally used in delay critical timing paths of high performance microprocessors and DSP's circuits to improve frequency and timing convergence. These flip-flops can reduce/remove process variation tax, clock skew/jitter tax, or fix timing violations resulting in higher operating frequency. The high operating frequency gain can easily be converted into lower power by reducing the supply voltage. The time borrowing flip-flops are designed by inserting clock inverters between master and slave latches by delaying the master latch. This results in time borrowing window which can be used to improve circuit performance. The delaying of master worsens the hold time of time borrowing flip-flop and requires min delay buffer insertion resulting in area and routing overhead.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

One of the limiters of $V_{MIN}$ is the sequential hold time degradation, or min-delay paths, at lower voltages resulting in frequency independent functional failures. Here, $V_{MIN}$ refers to the lowest operating supply voltage below which the memory or sequential unit may lose the data stored in them. Here, $V_{MIN}$ may also refer to the lowest operating supply voltage below which the sequential or memory may not reflect correct data because of retention, setup, or hold failures. The hold time failures are exacerbated at low supply voltages, but also can occur at nominal to high voltages. As such, a design of a sequential should tolerate the supply voltage variations. These min-delay paths are commonly found in the scan path of a time borrowing flip-flop since no logic needs to be performed.

Figure 1:
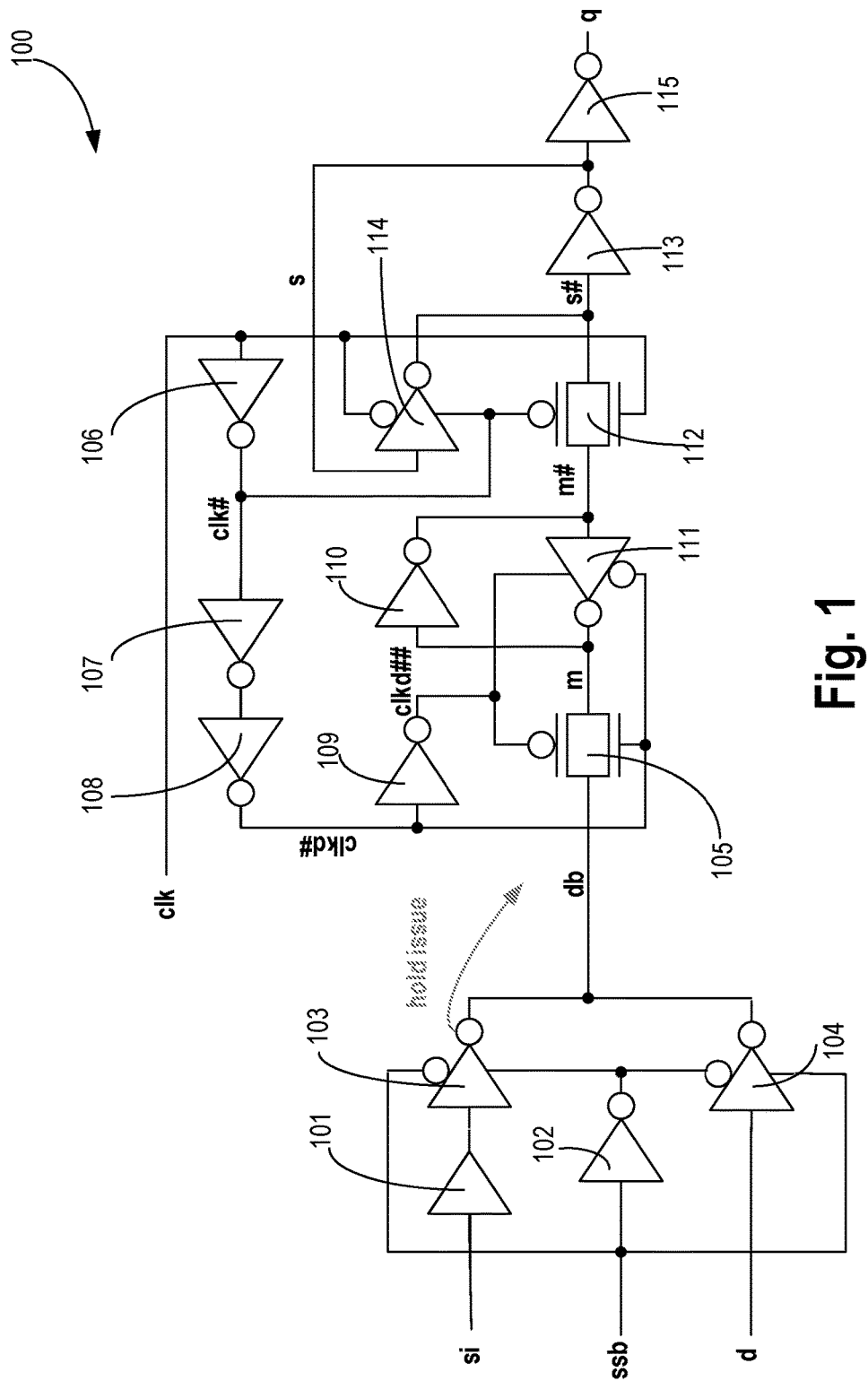
FIG. 1 illustrates a pass-gate (PG) based flip-flop (FF) with a time borrowing circuit.

FIG. 1 illustrates a pass-gate (PG) based flip-flop (FF) 100 with a time borrowing circuit. FF 100 consists of a scan multiplexer having buffer 101, inverter 102, and tristate-able inverters 103 and 104. An input of buffer 101 is coupled to a scan data input "si" node which provides the scan data. Here, labels for nodes and signals are interchangeably used. For example, "si" may refer to scan data input node or scan data on that node depending on the context of the sentence. Tristate-able inverter 103 receives the output of buffer 101 and controllably outputs on node "db" according to the signal conditions (e.g., logic high or logic low) of signals "ssb" and complementary of "ssb". Inverter 102 receives signal "ssb" and provides a complementary of "ssb" to tristate-able inverters 103 and 104. Tristate-able inverter 104 receives data 'd' and controllably outputs an inverse of that data on node "db" according to the signal conditions (e.g., logic high or logic low) of signals "ssb" and complementary of "ssb". As such, depending on the signal logic level of "ssb", either an inverse of "si" is provided to node "db" (e.g., in scan mode) or an inverse of 'd' is provided to node "db" (e.g., in data mode).

The time borrowing portion of FF 100 consists of a first pass-gate 105; a chain of clock inverters 106, 107, 108, and 109; inverters 110, 113, and 115; and tristate-able buffers 111 and 114 coupled together as shown. Output "clk#" of inverter 106 and "clk" are used to control the second pass-gate 112 and tristate-able inverter 114, which is part of a slave latch. Output "clkd#" of inverter 108 and output "clkd##" of inverter 109 is used to control the first pass-gate 105 and tristate-able inverter 111. Node "db" provides either an inverse of data or scan data "si" to pass-gate 105, which when opened, provides that data to node 'm'. Memory element formed by inverter 110 and tristate inverter 111 retain data on nodes 'm' and "m#". Data on node "m#" is then received by second pass-gate 112, which when opened, provides that data to node "s#". Memory element formed by inverter 113 and tristate-able inverter 114 retain data on nodes 's' and "s#". The output 'q' is a buffered version of the data on node "s#".

The time borrowing flip-flop 100 uses clock inverters between master and slave latches by delaying the master clock. This results in time borrowing window which can be used to improve circuit performance. The delaying of master clock worsens the hold time of time borrowing flip-flop 100 and requires minimum (min) delay buffer insertion resulting in area and routing overhead. Min-delay paths are commonly found in the scan path of a time borrowing flip-flop since no logic needs to be performed. This path starts from node "si" and passes through node "db", for example. To fix hold timing violations caused by such min-delay paths, min-delay buffers (e.g., buffer 101) are inserted to ensure that there are no functional issues during test. These min-delay path failures can be caused by systematic and random variations in the local clock inverters, which can pull-in a receiving flip-flop hold time.

Various embodiments describe a clock gated scan multiplexer time borrowing flip-flop circuit which gates the scan input multiplexer with clock to maintain the hold time requirement of the flip-flop to be same as the hold time of a non-time borrowing flip-flop. Some embodiments also describe another clock gated scan multiplexer time borrowing flip-flop circuit which also gates the data side of the input multiplexer with clock and eliminates the master transmission gate, and thus improving the flip-flop setup time.

As described with reference to FIG. 1, time borrowing flip-flop 100 does not have the same hold time as a non-time borrowing flip-flop and may require min delay buffer (e.g. buffer 101) insertion with area and routing overhead. The clock gated scan multiplexer time borrowing flip-flop of various embodiments maintains the same hold time as the hold time of a non-time borrowing flip at the scan input. The clock gated scan multiplexer time borrowing flip-flop of various embodiments reduces setup time by 0.8FO4/1.0FO4 (where FO4 refers to fan output of four) inverter delay while maintaining the scan hold time. In some embodiments, the time borrowing flip-flop can be vectorized to amortize clock gating circuit overhead.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back,", "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
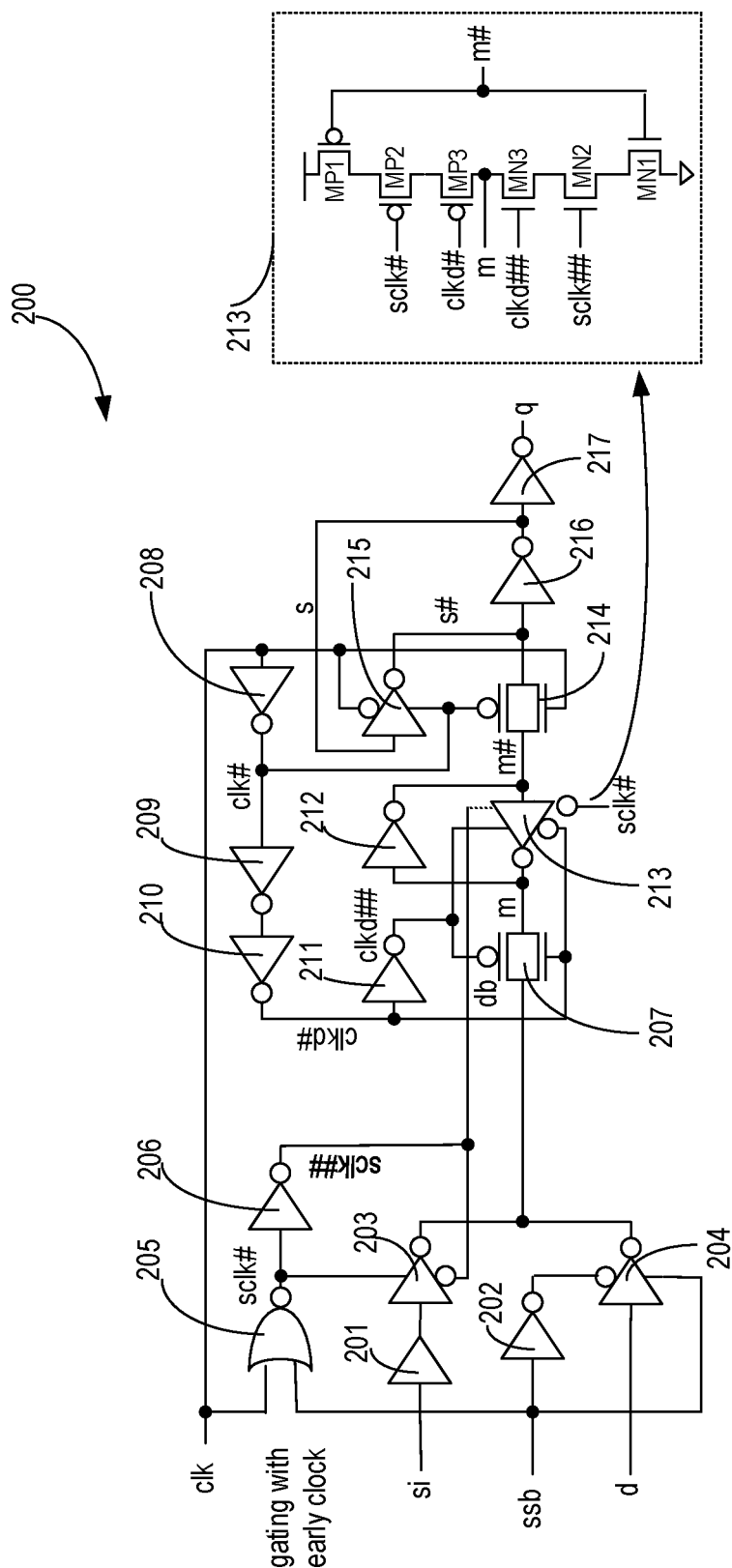
FIG. 2 illustrates a time borrowing FF with clock gating scan multiplexer, according to some embodiments of the disclosure.

FIG. 2 illustrates time borrowing FF 200 with clock gating scan multiplexer, according to some embodiments of the disclosure. In some embodiments, FF 200 comprises clock gated multiplexer, master latch, and slave latch. In some embodiments, the clock gated multiplexer comprises buffer 201, inverter 202, and tristate-able inverters 203 and 204. In some embodiments, buffer 201 is coupled to a scan data input "si" node which provides the scan data. Here, labels for nodes and signals are interchangeably used. For example, "si" may refer to scan data input node or scan data on that node depending on the context of the sentence. In some embodiments, tristate-able inverter 203 receives output of buffer 201 and controllably outputs on node "db" according to the signal conditions (e.g., logic high or logic low) of signals "ssb" and clock "clk".

In some embodiments, FF 200 comprises NOR gate 205 and inverter 206 to provide control signals for tristate-able inverters 203 and 213 (disused with reference to master latch). In some embodiments, inputs of NOR gate 205 are clock "clk" and "ssb" which performs a NOR operation on "clk" and "ssb" and generates "sclk#" as output. In some embodiments, inverter 206 receives "sclk#" as input and generates an inverted version of "sclk#" as "sclk##". In some embodiments, "sclk#" and "sclk##" are used to control tristate-able inverters 203 and 213.

In some embodiments, tristate-able inverter 204 receives data and controllably outputs an inverse of that data on node "db" according to the signal conditions (e.g., logic high or logic low) of signals "ssb" and complementary of "ssb". In some embodiments, tristate-able inverter 203 receives output of buffer 201 and controllably outputs on node "db" according to the signal conditions (e.g., logic high or logic low) of signals "ssb" and clock "clk". As such, depending on the signal logic level of "ssb" and/or "clk" either an inverse of "si" is provided to node "db" (e.g., in scan mode) or an inverse of 'd' is provided to node "db" (e.g., in data mode).

In some embodiments, FF 200 comprises a chain of inverters 208, 209, 210, and 211 coupled together as shown. In some embodiments, input of inverter 208 is "clk" and the output of inverter 208 is "clk#". In some embodiments, the output of inverter 210 is "clkd#" and output of inverter 211 is "clkd##".

In some embodiments, master latch comprises pass-gate 207 and a memory element comprising inverter 212 and tristate-able inverter 213. In some embodiments, first pass-gate 207 is coupled to node "db" and node "m" and controllable by "clkd##" and "clkd#". In some embodiments, the input of inverter 212 is coupled to node "m", and the output of inverter 212 is coupled to node "m#". In some embodiments, tristate-able inverter 213 has an input coupled to node "m#" and an output coupled to node "m". In some embodiments, tristate-able inverter 213 is controllable by "clkd##", "sclk##", "clkd#" and "sclk#". One embodiment of tristate-able inverter 213 is shown in FIG. 2.

In some embodiments, tristate-able inverter 213 comprises p-type transistors MP1, MP2, and MP3, and n-type transistors MN1, MN2, and MN3 coupled together in series forming a stack of transistors between supply (Vdd) and ground (Vss). In some embodiments, gate terminals of transistors MP1 and MN1 are coupled to node "m#". In some embodiments, the gate terminal of transistor MP2 is controlled by "sclk#". In some embodiments, the gate terminal of transistor MP3 is controlled by "clkd#". In some embodiments, the gate terminal of transistor MN2 is coupled to "sclk##". In some embodiments, the gate terminal of transistor MN3 is coupled to "clkd##". In some embodiments, the drain terminals of transistors MP3 and MN3 are coupled to node 'm'.

In some embodiments, the slave latch comprises pass-gate 214, tristate-able inverter 215, and inverters 216 and 217. In some embodiments, second pass-gate 214 is coupled to nodes "m3" and "s#", and where pass-gate 214 is controlled by "clk#" and "clk". In some embodiments, tristate-able inverter 215 and inverter 216 form a memory element. In some embodiments, inverter 215 has an input coupled to node "s#" and an output coupled to node 's'. In some embodiments, tristate-able inverter 215 has an input coupled to node 's' and an output coupled to node "s#", where tristate-able inverter 215 is controllable by "clk" and "clk#". In some embodiments, inverter 217 provides output 'q' by inverting signal on node 's'.

A scan select signal (ssb) is clock gated using a NOR and an inverter to create early clock signals "sclk#" and "sclk##". These early clock signals have the same timing characteristics as the timing characteristics of the clock signals in the non-time borrowing flip-flops, for example. In some embodiments, the "sclk#" and "sclk##" are used to gate the scan input multiplexer tristate-able inverter 203, resulting in the same hold time on the scan path as the hold time in the non-time borrowing flip-flops. In some embodiments, the tristate keeper 213 of the master latch is converted to a triple stack and gated with these early clocks to enable writing into the master latch with the early clock signals. Since these early clock signals are active during scan, they may not add to the clock power during normal operation, in accordance with some embodiments.

Figure 3:
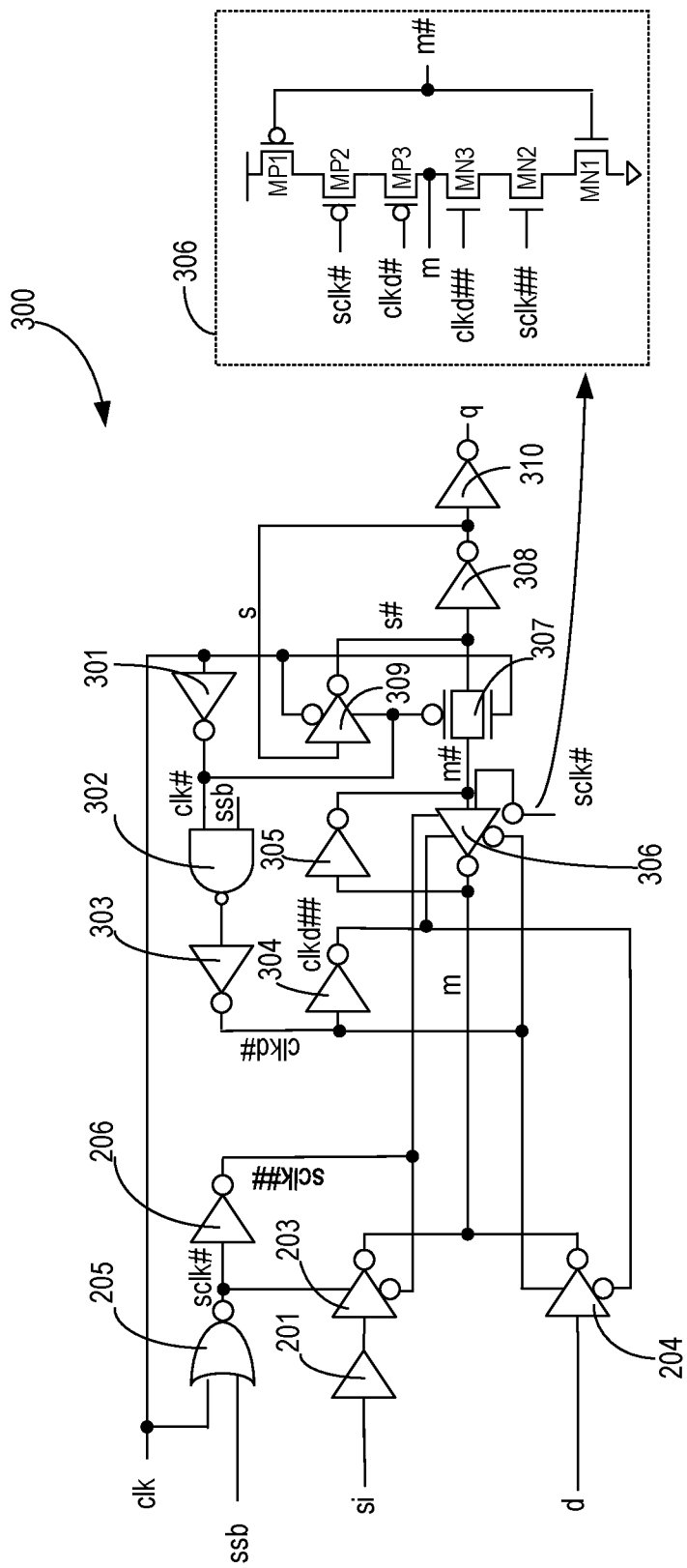
FIG. 3 illustrates a time borrowing FF with clock gating scan and data input multiplexer, according to some embodiments of disclosure.

FIG. 3 illustrates time borrowing FF 300 with clock gating scan and data input multiplexer, according to some embodiments of disclosure. It is pointed out that those elements of FIG. 3 having the same reference numbers (or names) as the elements of any other figure can operate or function in any manner similar to that described, but are not limited to such.

Compared to FIG. 2, here tristate-able inverter 204 is controlled by "clkd#" and "clkd##" instead of "ssb" and "ssb#". As such, inverter 202 is removed in FF 300. Here, pass-gate 207 is removed and so node 'm' is coupled to the output of the multiplexer (e.g., output of tristate-able inverters 203 and 204).

In some embodiments, FF 300 comprises inverter 301, NAND gate 302, inverter 303, inverter 304, inverter 305, tristate-able inverter 306 (having a structure similar to tristate-able inverter 213 of FIG. 2), pass-gate 307, inverter 308, and tristate-able buffer 309. In some embodiments, NAND gate 302 receives "clk#" and "ssb" as inputs.

In some embodiments, FF 300 comprises memory element including inverter 305 and tristate-able inverter 306. In some embodiments, the input of inverter 305 is coupled to node 'm', and the output of inverter 305 is coupled to node "m#". In some embodiments, tristate-able inverter 306 has an input coupled to node "m#" and an output coupled to node 'm'. In some embodiments, tristate-able inverter 306 is controllable by "clkd##", "sclk##", "clkd#" and "sclk#". One embodiment of tristate-able inverter 306 is shown in FIG. 3.

In some embodiments, tristate-able inverter 306 comprises p-type transistors MP1, MP2, and MP3, and n-type transistors MN1, MN2, and MN3 coupled together in series forming a stack of transistors between supply (Vdd) and ground (Vss). In some embodiments, the gate terminals of transistors MP1 and MN1 are coupled to node "m#". In some embodiments, the gate terminal of transistor MP2 is controlled by "sclk#". In some embodiments, the gate terminal of transistor MP3 is controlled by "clkd#". In some embodiments, the gate terminal of transistor MN2 is coupled to "sclk##". In some embodiments, the gate terminal of transistor MN3 is coupled to "clkd##". In some embodiments, the drain terminals of transistors MP3 and MN3 are coupled to node 'm'.

In some embodiments, FF 300 comprises pass-gate 307, tristate-able inverter 309, and inverters 308 and 310. In some embodiments, pass-gate 307 is coupled to nodes "m3" and "s#", and where pass-gate 307 is controlled by "clk#" and "clk". In some embodiments, tristate-able inverter 309 and inverter 308 form a memory element. In some embodiments, inverter 308 has an input coupled to node "s#" and an output coupled to node 's'. In some embodiments, tristate-able inverter 309 has an input coupled to node 's' and an output coupled to node "s#", where tristate-able inverter 309 is controllable by "clk" and "clk#". In some embodiments, inverter 310 provides output 'q' by inverting signal on node 's'.

FF 300 is an alternate version of clock gated scan input multiplexer time borrowing flip-flop, in accordance with some embodiments. In FF 300, time borrowing inverters are converted into NAND/inverter 302 which are gated by a scan select signal (ssb) to generate gated "clkd#" and "clkd##", according to some embodiments. These "clkd#" and "clkd##" are used to gate the data input multiplexer tristate-able inverter 204. In some embodiments, since both data and scan side of the multiplexer are clock gated, it eliminates the need of master transmission gate 207 and scan select inverter 202. Removing master transmission gate 207 from the flip-flop path results in improved setup, according to some embodiments. As in the FF 200, the clock gated scan input multiplexer of FF 300 maintains the hold time to be same as the hold time of a non-time borrowing flip-flop, in accordance with some embodiments.

Figure 4:
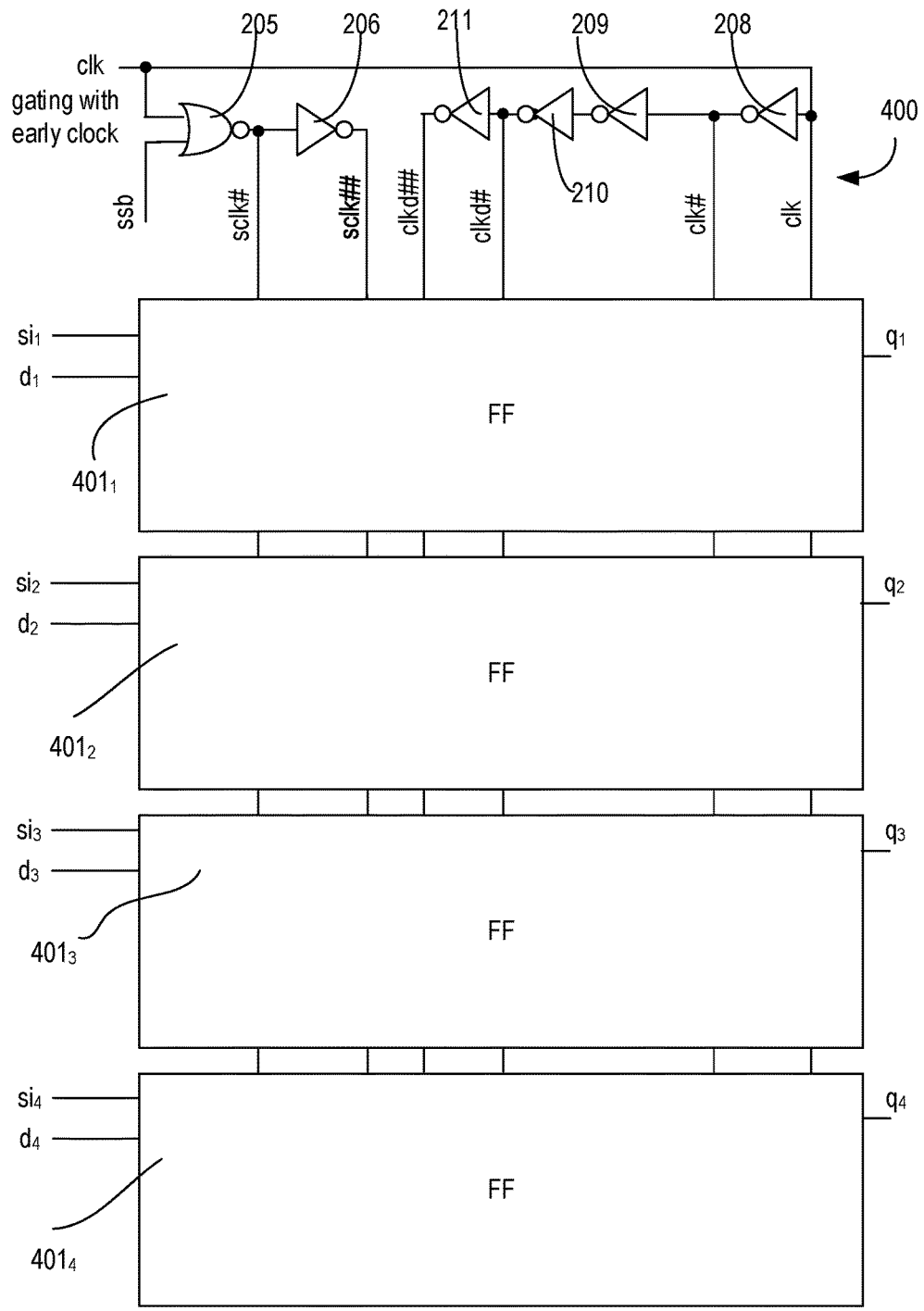
FIG. 4 illustrates a time borrowing vectored FF with clock gating scan multiplexer, according to some embodiments of the disclosure.

FIG. 4 illustrates time borrowing vectored FF 400 with clock gating scan multiplexer, according to some embodiments of the disclosure. It is pointed out that those elements of FIG. 4 having the same reference numbers (or names) as the elements of any other figure can operate or function in any manner similar to that described, but are not limited to such.

In some embodiments, vectored FF 400 comprises FFs $401_{1-4}$, NOR gate 205, inverter 206, and chain of inverters 208, 209, 210, and 211. Each FF from among FFs $401_{1-4}$ comprises the multiplexer, master latch, and slave latch of FIG. 2, while NOR gate 205, inverter 206, and chain of inverters 208, 209, 210, and 211 are shared with all FFs, in accordance with some embodiments. As such, the clock gating circuit overhead is amortized, for example. In some embodiments, FF $401_1$ receives inputs "$si_1$", "$d_1$", "ssb", "sclk#", "sclk##", "clkd##", "clkd#", "clk#", and "clk", and generates output "$q_1$". In some embodiments, FF 4012 receives inputs "$si_2$", "$d_2$", "ssb", "sclk#", "sclk##", "clkd##", "clkd#", "clk#", and "clk", and generates output "$q_2$". FF $401_3$ receives inputs "$si_3$", "$d_3$", "ssb", "sclk#", "sclk##", "clkd##", "clkd#", "clk#", and "clk", and generates output "$q_3$". FF $401_4$ receives inputs "$si_4$", "$d_4$", "ssb", "sclk#", "sclk##", "clkd##", "clkd#", "clk#", and "clk", and generates output "$q_4$". While FIG. 4 is illustrated with four FFs forming the time borrowing vectored FF, any number of FFs can be vectored together in accordance with some embodiments.

Figure 5:
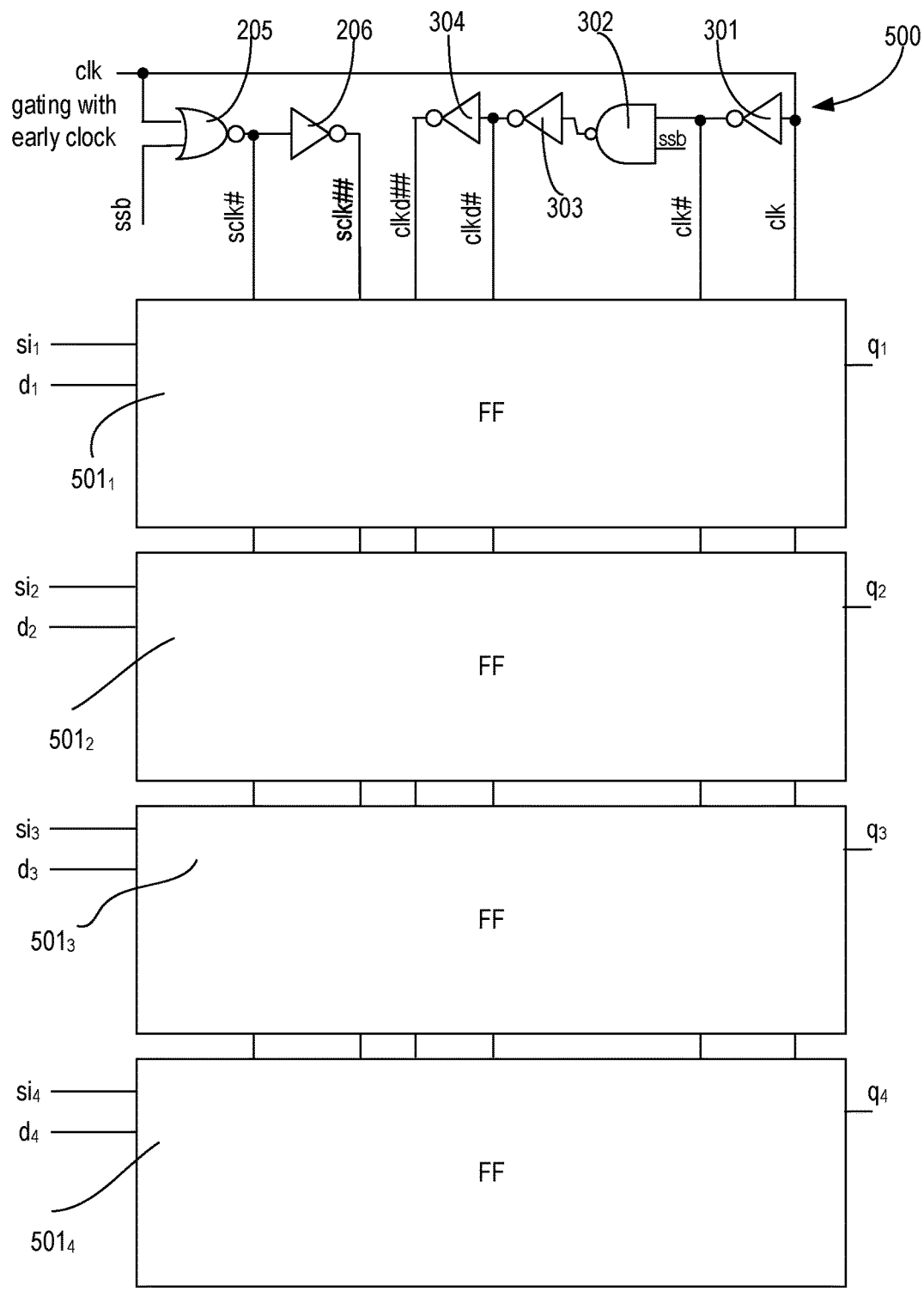
FIG. 5 illustrates a time borrowing vectored FF with clock gating scan and data input multiplexer, according to some embodiments of the disclosure.

FIG. 5 illustrates time borrowing vectored FF 500 with clock gating scan and data input multiplexer, according to some embodiments of the disclosure. It is pointed out that those elements of FIG. 5 having the same reference numbers (or names) as the elements of any other figure can operate or function in any manner similar to that described, but are not limited to such.

In some embodiments, vectored FF 500 comprises FFs $501_{1-4}$, NOR gate 205, inverter 206, and chain of inverters 301, 303, and 304, and NAND gate 302. Each FF from among FFs $501_{1-4}$ comprises the multiplexer and sequential components of FIG. 3, while NOR gate 205, inverter 206, and chain of inverters 301, 303, and 304, and NAND gate 302 are shared with all FFs, in accordance with some embodiments. As such, the clock gating circuit overhead is amortized.

In some embodiments, FF $501_1$ receives inputs "$si_2$", "$d_1$", "ssb", "sclk#", "sclk##", "clkd##", "clkd#", "clk#", and "clk", and generates output "$q_1$". In some embodiments, FF 5012 receives inputs "$si_2$", "$d_2$", "ssb", "sclk#", "sclk##", "clkd##", "clkd#", "clk#", and "clk", and generates output "$q_2$". In some embodiments, FF 5013 receives inputs "$si_3$", "$d_3$", "ssb", "sclk#", "sclk##", "clkd##", "clkd#", "clk#", and "clk", and generates output "$q_3$". In some embodiments, FF $501_4$ receives inputs "$si_4$", "$d_4$", "ssb", "sclk#", "sclk##", "clkd##", "clkd#", "clk#", and "clk", and generates output "$q_4$". While FIG. 5 is illustrated with four FFs to form a time borrowing vectored FF, any number of FFs can be vectored together in accordance with some embodiments.

Figure 6:
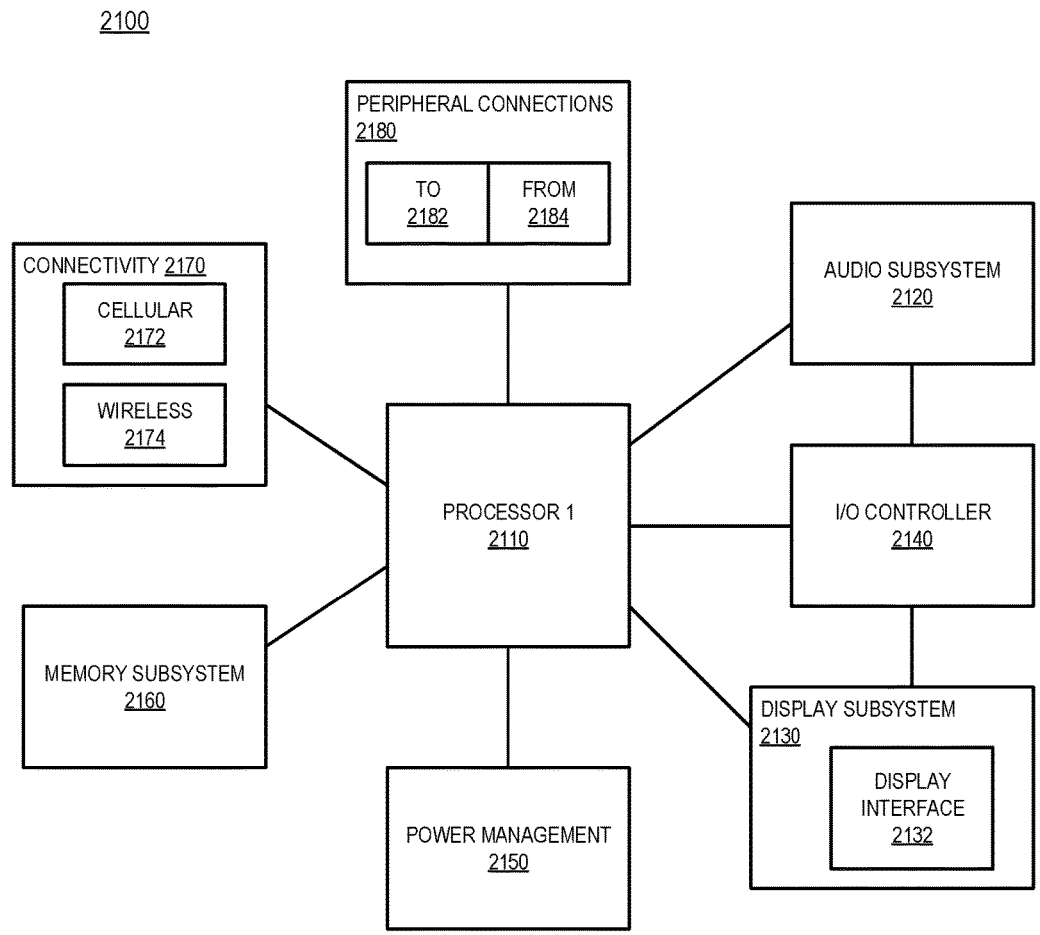
FIG. 6 illustrates a smart device or a computer system or a SoC (System-on-Chip) with time borrowing FFs, in accordance with some embodiments.

FIG. 6 illustrates a smart device or a computer system or a SoC (System-on-Chip) with time borrowing FFs, in accordance with some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with time borrowing FFs 200/300, according to some embodiments discussed. Other blocks of the computing device 2100 may also include an integrated clock gate circuit time borrowing FFs 200/300 according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a clock node; a first input data node; a second input data node; a control node; an output node; a NOR gate having a first input coupled to the clock node, and a second input coupled to the control node; an inverter having an input coupled to an output of the NOR gate; a multiplexer comprising: a first input coupled to the first input data node, a second input coupled to the second input data node; a first select input coupled the first control node; and a second select input coupled to the output of the NOR gate; and a sequential coupled to the multiplexer, the sequential comprising: a data input coupled to an output of the multiplexer; a select input coupled to an output of the inverter; a master latch coupled to the data input and the select input; and a slave latch coupled to an output of the master latch and the clock node, wherein the slave latch has an output coupled to the output node.

In some embodiments, the multiplexer comprises: a first tristate-able inverter having an input coupled to the first input, and having control inputs coupled to the first select input and a complementary of the first select input, wherein the first tristate-able inverter has an output coupled to the output of the multiplexer. In some embodiments, the multiplexer comprises: a second tristate-able inverter having an input coupled to the second input via a buffer, and having control inputs coupled to the second select input and the output of the inverter, wherein the second tristate-able inverter has an output coupled to the output of the multiplexer. In some embodiments, the sequential comprises a chain of inverters coupled together such that an input of the chain is coupled to the clock node, wherein a first output of the chain is coupled to the slave latch, wherein a second output of the chain is coupled to the master latch, and wherein a third output of the chain is coupled to the master latch.

In some embodiments, the master latch of the sequential comprises: a first pass-gate coupled to the output of the multiplexer, wherein the first pass-gate comprises a first control input coupled to the second output of the chain, and a second control input coupled to the third output of the chain. In some embodiments, the master latch comprises a first memory including: an inverter having an input coupled to the output of the first pass-gate; and a keeper coupled to the inverter and the first pass-gate, wherein the keeper comprises a stack of transistors some of which are coupled to: the output of the NOR gate, the output of the inverter which is coupled to the NOR gate, the third output of the chain of inverters, and the second output of the chain of inverters.

In some embodiments, the slave latch comprises: a second pass-gate coupled to an output of the inverter of the master latch, wherein the second pass-gate comprises a first control input coupled to the first output of the chain, and a second control input coupled to the clock node. In some embodiments, the slave latch comprises a second memory including: an inverter having an input coupled to an output of the second pass-gate; and a tristate-able inverter coupled to an output of the inverter and the second pass-gate, wherein the tristate-able inverter comprises a stack of transistors some of which are coupled to: the output of the inverter, the first output of the chain of inverters, and the clock node. In some embodiments, the apparatus comprises an output inverter including: an input coupled to the output of the inverter of the slave latch, and an output coupled to the output node.

In another example, a system is provided which comprises: a memory; a processor coupled to the memory, the processor having a time-borrowing sequential which comprises an apparatus according to the apparatus described above; and a wireless interface for allowing the processor to communicate with another device. In some embodiments, the system comprises a display which is operable to display contents processed by the processor.

In another example, an apparatus is provided which comprises: a multiplexer which is gated by a clock; and a flip-flop coupled to the multiplexer, wherein the flip-flop has a chain of at least four inverters one of which has an input to receive the clock. In some embodiments, the clock is to gate a scan input to the multiplexer. In some embodiments, the flip-flop comprises a master latch and a slave latch, wherein the master latch is to receive a clock which is an output of the fourth inverter of the at least four inverters. In some embodiments, the slave latch is to receive the clock. In some embodiments, the multiplexer and the flip-flop are positioned in a critical data timing path.

In another example, a system is provided which comprises: a memory; a processor coupled to the memory, the processor having a time-borrowing sequential which comprises an apparatus according to the apparatus described above; and a wireless interface for allowing the processor to communicate with another device. In some embodiments, the system comprises a display which is operable to display contents processed by the processor.

In another example, a method is provided which comprises: gating a multiplexer by a clock; and providing an input to a flip-flop from the multiplexer, wherein the flip-flop has a chain of at least four inverters one of which has an input to receive the clock. In some embodiments, gating the multiplexer comprises gating a scan input to the multiplexer. In some embodiments, the input is received by a master latch of the flip-flop. In some embodiments, the input is received by a slave latch of the flip-flop. In some embodiments, the method comprises positioning the multiplexer and the flip-flop a critical data timing path.

In another example, an apparatus is provided which comprises: means for gating a multiplexer by a clock; and means for providing an input to a flip-flop from the multiplexer, wherein the flip-flop has a chain of at least four inverters one of which has an input to receive the clock. In some embodiments, the means for gating the multiplexer comprises gating a scan input to the multiplexer. In some embodiments, the input is received by a master latch of the flip-flop. In some embodiments, the input is received by a slave latch of the flip-flop. In some embodiments, the multiplexer and the flip-flop a critical data timing path.

In another example, a system is provided which comprises: a memory; a processor coupled to the memory, the processor having a time-borrowing sequential which comprises an apparatus according to the apparatus described above; and a wireless interface for allowing the processor to communicate with another device. In some embodiments, the system comprises a display which is operable to display contents processed by the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a switch gated by a clock; and
   a flip-flop coupled to the switch, wherein the flip-flop includes a chain of at least four inverting logics, and wherein one of the four inverting logics has an input to receive the clock,
   wherein the clock is to gate a scan input to the switch.

2. The apparatus of claim 1, wherein the clock is to gate a data input to the switch.

3. The apparatus of claim 1, wherein the flip-flop comprises a master latch and a slave latch, wherein the master latch is to receive a clock which is an output of a fourth inverting logic of the at least four inverting logics.

4. The apparatus of claim 3, wherein the slave latch is to receive the clock.

5. The apparatus of claim 1, wherein the switch and the flip-flop are positioned in a critical data timing path.

6. The apparatus of claim 1, wherein one of the four inverting logics includes a NAND logic gate.

7. The apparatus of claim 1, wherein one of the four inverting logics includes an inverter logic gate.

8. An apparatus comprising:
   a switch gated by a clock;
   a chain of four inverting logic gates, wherein one of the four inverting logic gates has an input to receive the clock; and
   a vectored flip-flop circuitry comprising:
      a first flip-flop to receive a first data input and a first scan input, and to generate a first output, wherein the first flip-flop is coupled to the switch and at least one of the four inverting logic gates, and wherein the clock is to gate the first scan input; and
      a second flip-flop to receive a second data input and a second scan input, and to generate a second output, wherein the second flip-flop is coupled to the switch and at least one of the four inverting logic gates.

9. The apparatus of claim 8, wherein one of the four inverting logic gates includes a NAND logic gate.

10. The apparatus of claim 8, wherein one of the four inverting logic gates includes an inverter logic gate.

11. The apparatus of claim 8, wherein the switch comprises a NOR gate.

12. The apparatus of claim 8, wherein the first or second flip-flop comprises a master latch and a slave latch, wherein the master latch is to receive a clock which is an output of a fourth inverting logic gate of the at least four inverting logic gates.

13. The apparatus of claim 12, wherein the slave latch is to receive the clock.

14. The apparatus of claim 8, wherein the switch and the vectored flip-flop are positioned in a critical data timing path.

15. A system comprising:
   a processor;
   a memory coupled to the processor, wherein the processor includes:
      a switch gated by a clock; and
      a flip-flop coupled to the switch, wherein the flip-flop includes a chain of at least four inverting logics, wherein one of the four inverting logics has an input to receive the clock, and wherein the clock is to gate a scan input to the switch; and
   a wireless interface to allow the processor to communicate with another device.

16. The system of claim 15, wherein one of the four inverting logics includes a NAND logic gate.

17. The system of claim 15, wherein one of the four inverting logics includes an inverter.

18. The system of claim 15, wherein the clock is to gate a data input to the switch.

* * * * *